United States Patent
Horikawa

(10) Patent No.: US 8,026,184 B2
(45) Date of Patent: Sep. 27, 2011

(54) SEMICONDUCTOR DEVICE AND METHOD OF MANUFACTURING THE SAME

(75) Inventor: Mitsuhiro Horikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 339 days.

(21) Appl. No.: 11/965,840

(22) Filed: Dec. 28, 2007

(65) Prior Publication Data

US 2008/0157279 A1  Jul. 3, 2008

(30) Foreign Application Priority Data

Dec. 28, 2006  (JP) ................. 2006-355441

(51) Int. Cl.
  *H01L 29/72*  (2006.01)
(52) U.S. Cl. ........ 438/773; 438/622; 438/623; 438/393; 438/396; 438/381; 438/681; 438/763; 438/785
(58) Field of Classification Search .................. 438/381, 438/393, 396, 622, 623, 681, 763, 773, 785
  See application file for complete search history.

(56) References Cited

U.S. PATENT DOCUMENTS

| | | | |
|---|---|---|---|
| 6,285,051 B1 | 9/2001 | Ueda et al. | |
| 2003/0052374 A1 | 3/2003 | Lee et al. | |
| 2006/0273426 A1* | 12/2006 | Iijima | 257/532 |
| 2008/0064209 A1* | 3/2008 | Millward | 438/681 |

FOREIGN PATENT DOCUMENTS

| | | |
|---|---|---|
| JP | 11-330411 | 11/1999 |
| JP | 2003-100908 | 4/2003 |
| JP | 2003-124348 | 4/2003 |
| JP | 2003-243534 | 8/2003 |
| JP | 2006-324363 | 11/2006 |

OTHER PUBLICATIONS

Oyo Buturi, vol. 75, No. 9, 2006, pp. 1080-1090, with English abstract.
H. Watanabe et al., "Device application and structure observation for hemispherical-grained Si", J. Appl. Phys., vol. 71, No. 7, 1992, pp. 3538-3543.
Japanese Patent Office issued a Japanese Office Action dated Mar. 17, 2009, Application No. 2006-355441.

* cited by examiner

*Primary Examiner* — Edward Wojciechowicz
(74) *Attorney, Agent, or Firm* — Young & Thompson

(57) ABSTRACT

Disclosed is a method of manufacturing a semiconductor device formed by laminating a capacitor including a bottom metal electrode, a capacitive insulating film, and an upper metal electrode. When the capacitive insulating film is formed by performing a first step of forming a first dielectric layer on the bottom metal electrode by a vapor phase film forming method using a precursor gas that contains constituent elements of a dielectric; and a second step of forming a second dielectric layer on the first dielectric layer by a vapor phase film forming method using a precursor gas that contains constituent elements of a dielectric, a film forming temperature in the first step is set so as to be lower than a film forming temperature in the second step.

8 Claims, 8 Drawing Sheets

SEMICONDUCTOR DEVICE AND METHOD OF MANUFACTURING THE SAME

BACKGROUND OF THE INVENTION

Priority is claimed on Japanese Patent Application No. 2006-355441, filed Dec. 28, 2006, the contents of which are incorporated herein by reference.

FIELD OF THE INVENTION

The present invention relates to a semiconductor device having a capacitor laminated in the form of a cylinder on a semiconductor substrate for use in a dynamic random access memory (DRAM), which is a so-called stacked capacitor, and a method of manufacturing the same.

DESCRIPTION OF THE RELATED ART

A capacitor structure of a DRAM (Dynamic Random Access Memory) includes an MIS (Metal Insulator Semiconductor) structure and an MIM (Metal Insulator Metal) structure (for example, see FIGS. 1 and 2 of Japanese Unexamined Patent Application, First Publication No. 2003-243534).

In general, polycrystalline silicon doped with dopants is used for a semiconductor having the MIS structure. An example of an insulator in the MIS structure may include silicon oxide ($SiO_2$), silicon nitride ($Si_3N_4$), tantalum pentaoxide ($Ta_2O_5$), aluminum oxide ($Al_2O_3$), hafnium oxide ($HfO_2$), etc. An example of metal in the MIS structure may include titanium nitride (TiN), ruthenium (Ru), tungsten nitride (WN), etc. Such technical trend is disclosed in, for example, Non-Patent Document: "OYO BUTURI, Volume 75, No. 9 (2006), p 1080-p 1090".

DRAM requires a capacitor having large capacitance and low leakage current.

Capacitance C is obtained by a formula of $C=\epsilon_0\epsilon_r(S/t)$ (where, $\epsilon_0$ and $\epsilon_r$ are vacuum dielectric constant and relative dielectric constant of an insulating film (capacitive insulating film), respectively, S is an area of an electrode, and t is thickness of the insulating film.). From this formula, it can be seen that a method of increasing the capacitance C may include a method of increasing the area S of the electrode, a method of increasing the relative dielectric constant $\epsilon_r$ of the insulating film, and a method of decreasing the thickness t of the insulating film.

Of these methods, it is ease to decrease the thickness t. However, if the thickness is small, tunnel current may flow, thereby increasing leakage current. Therefore, the thickness t has not to become too small. In order to increase the capacitance C with little change of the thickness t, first, an insulating film having a larger relative dielectric constant $\epsilon_r$ may be used. This is because the capacitance C can be increased, even with the thickness t unchanged, if the relative dielectric constant $\epsilon_r$ of the insulating film is large.

From this point of view, one electrode of the capacitor of the above-mentioned MIS structure is made of polycrystalline silicon, and this polycrystalline silicon electrode is inevitably oxidized to produce silicon oxide at an interface between an insulating film and the polycrystalline silicon electrode. The produced silicon oxide is chemically stable and has a large band gap, and thus assists in decreasing leakage current. However, the silicon oxide has the smallest relative dielectric constant $\epsilon_r$ among the insulators as mentioned earlier.

In addition, the polycrystalline silicon electrode has conductivity by doping, for example, phosphorus (P) therein. When a voltage is applied to the polycrystalline silicon electrode doped with the dopant, depletion capacitance is added, which results in increase of the total capacitance. Accordingly, in order to effectively increase the capacitance C of the MIS structure, the method of increasing the relative dielectric constant $\epsilon_r$ of the insulating film has to be used in combination with the method of increasing the electrode area S.

In this connection, Japanese Unexamined Patent Application, First Publication No. 2003-243534 discloses a method of twice increasing an area of a polycrystalline silicon electrode using a HSG (Hemi-Spherical Grained) silicon technique. The HSG silicon technique is a technique of forming unevenness on polycrystalline silicon by growing hemispherical grains on the polycrystalline silicon (for example, see Non-Patent Document: "H. Watanabe, N. Aoto, S. Adachi, and r. Kikkawa, J. Appl. Phys. 71 (1992) p 3538-p 3534"). As disclosed in Japanese Unexamined Patent Application, First Publication No. 2003-243534, the HSG silicon technique is used to form an uneven polycrystalline silicon electrode in an inner side of a cylindrical hole.

In the structure where the uneven polycrystalline silicon electrode is formed in the inner side of the cylindrical hole, unevenness of polycrystalline silicon may block the cylindrical hole in the progress of miniaturization of polycrystalline silicon electrode. In addition, it is very difficult to form an insulating film and a metal electrode on the uneven polycrystalline silicon electrode with good step coverage.

The MIM structure has been developed to avoid such demits of the MIS structure. The MIM structure has no problem of electrode depletion and polycrystalline silicon in the MIM structure will not be oxidized. As described above, in order to secure large capacitance in the progress of miniaturization, a capacitor structure is necessarily shifted from the MIS structure to the MIM structure.

However, the MIM structure has the following problems. Among the problems, one is that a surface of a bottom metal electrode is damaged in the process of forming an insulating film on the bottom metal electrode, which may result in increase of leakage current due to an electrical defect.

Also, in general, an insulating film is formed by a CVD (chemical vapor deposition) technique or an ALD (atomic layer deposition) technique with an organic material as a precursor. With these techniques, carbon, hydrogen, nitrogen and so on included in the precursor are mixed as impurities into the insulating film. When these impurities are mixed into the insulating film, they cause electrical defect, thereby increasing leakage current, changing a structure of the insulating film, and hence deteriorating reliability of a semiconductor device.

To avoid such problems, there has been proposed a method of subjecting an insulating film to a post annealing treatment in order to reduce organic impurities from the insulating film. However, in the MIM structure, since heat resistance of a metal electrode is lower than that of polycrystalline silicon of an MIS electrode, there arises a problem of limitation on the conditions of post annealing.

In consideration of the above circumstances, an object of the present invention is to provide a method of manufacturing a semiconductor device with large capacitance, which is capable of suppressing a defect from occurring at an interface between a bottom metal electrode and a capacitive insulating film and in the capacitive insulating film in a process of forming the capacitive insulating film, and a semiconductor device manufactured by the method.

SUMMARY OF THE INVENTION

To achieve the above object, the present invention employed the following solutions.

(1) There is provided a method of manufacturing a semiconductor device formed by laminating a capacitor including a bottom metal electrode, a capacitive insulating film, and an upper metal electrode, wherein, when the capacitive insulating film is formed by performing a first step of forming a first dielectric layer on the bottom metal electrode by a vapor phase film forming method using a precursor gas that contains constituent elements of a dielectric; and a second step of forming a second dielectric layer on the first dielectric layer by a vapor phase film forming method using a precursor gas that contains constituent elements of a dielectric, a film forming temperature in the first step is set so as to be lower than a film forming temperature in the second step.

With this configuration, in the process of forming the insulating film, since defect at an interface between the bottom metal electrode and the capacitive insulating film and in the capacitive insulating film can be suppressed, it is possible to manufacture a semiconductor device having large capacitance.

(2) An atomic layer deposition method may be used as the vapor phase film forming method in the first step and the second step.

In this case, the first and second dielectric layers can be formed with uniform film quality and good step coverage while controlling their film thickness with high precision.

(3) The atomic layer deposition method in the first step and the second step may perform alternately: a step of forming a metal film by depositing metal, which is produced by reaction of a precursor gas that contains metal, on a film; and a step of oxidizing the metal film by an oxidation gas and changing the oxidized metal film into a dielectric layer.

In this case, the first and second dielectric layers can be formed with uniform film quality and good step coverage while controlling their film thickness with high precision.

(4) Vapor may be used as the oxidation gas in the first step.

In this case, defect at an interface between the bottom metal electrode and the first dielectric layer can be suppressed to be fewer.

(5) An ozone gas may be used as the oxidation gas in the second step.

In this case, defect in the capacitive insulating film can be suppressed to be fewer.

(6) Oxygen permeability of the first dielectric layer may be set so as to be lower than oxygen permeability of the second dielectric layer.

In this case, defect at an interface between the bottom metal electrode and the first dielectric layer can be suppressed to be fewer.

(7) Nitrogen may be supplied in a film forming atmosphere in the first step.

In this case, defect at an interface between the bottom metal electrode and the first dielectric layer can be suppressed to be fewer.

(8) At least one of a silicon nitride and an aluminum oxide may be used as a main material of the first dielectric layer formed in the first step.

In this case, defect at an interface between the bottom metal electrode and the first dielectric layer can be suppressed to be fewer.

(9) A semiconductor device of the present invention is manufactured by the method according to any one of the above items (1) to (8).

(10) There is provided a semiconductor device formed by laminating a capacitor including a bottom metal electrode, a capacitive insulating film, and an upper metal electrode, wherein: the capacitive insulating film includes a first dielectric layer and a second dielectric layer; when defect densities of the first dielectric layer and the second dielectric layer are compared in a film thickness direction, defect density of the first dielectric layer is lower than defect density of the second dielectric layer at a side of the bottom metal electrode when film thickness is less than 7 nm; and the second dielectric layer has defect density lower than defect density of the first dielectric layer at a side of the upper metal electrode from the center in the film thickness direction.

(11) There is provided a semiconductor device formed by laminating a capacitor including a bottom metal electrode, a capacitive insulating film, and an upper metal electrode, wherein: the capacitive insulating film includes a first dielectric layer and a second dielectric layer; and oxygen permeability of the first dielectric layer is lower than oxygen permeability of the second dielectric layer.

With these configurations, in the process of forming the insulating film, since defect at an interface between the bottom metal electrode and the capacitive insulating film and in the capacitive insulating film can be suppressed, it is possible to manufacture a semiconductor device having large capacitance.

(12) The first dielectric layer may be one of a silicon nitride, an aluminum oxide, and a tantalum pentaoxide.

(13) The second dielectric layer may be one of an aluminum oxide, a zirconium oxide, a hafnium oxide and a tantalum pentaoxide.

(14) It may be arranged such that the film thickness of the first dielectric layer is equal to or less than 2 nm, and the film thickness of the second dielectric layer is 2 nm to 7 nm.

As described above, in the process of forming the capacitive insulating film, defect at an interface between the bottom metal electrode and the capacitive insulating film and in the capacitive insulating film can be suppressed. As a result, it is possible to manufacture a semiconductor device having limited leakage current and large capacitance.

DETAILED DESCRIPTION OF THE INVENTION

Hereinafter, a semiconductor device and a method of manufacturing the semiconductor device according to one embodiment of the present invention will be described with reference to the accompanying drawings.

Figure 1:
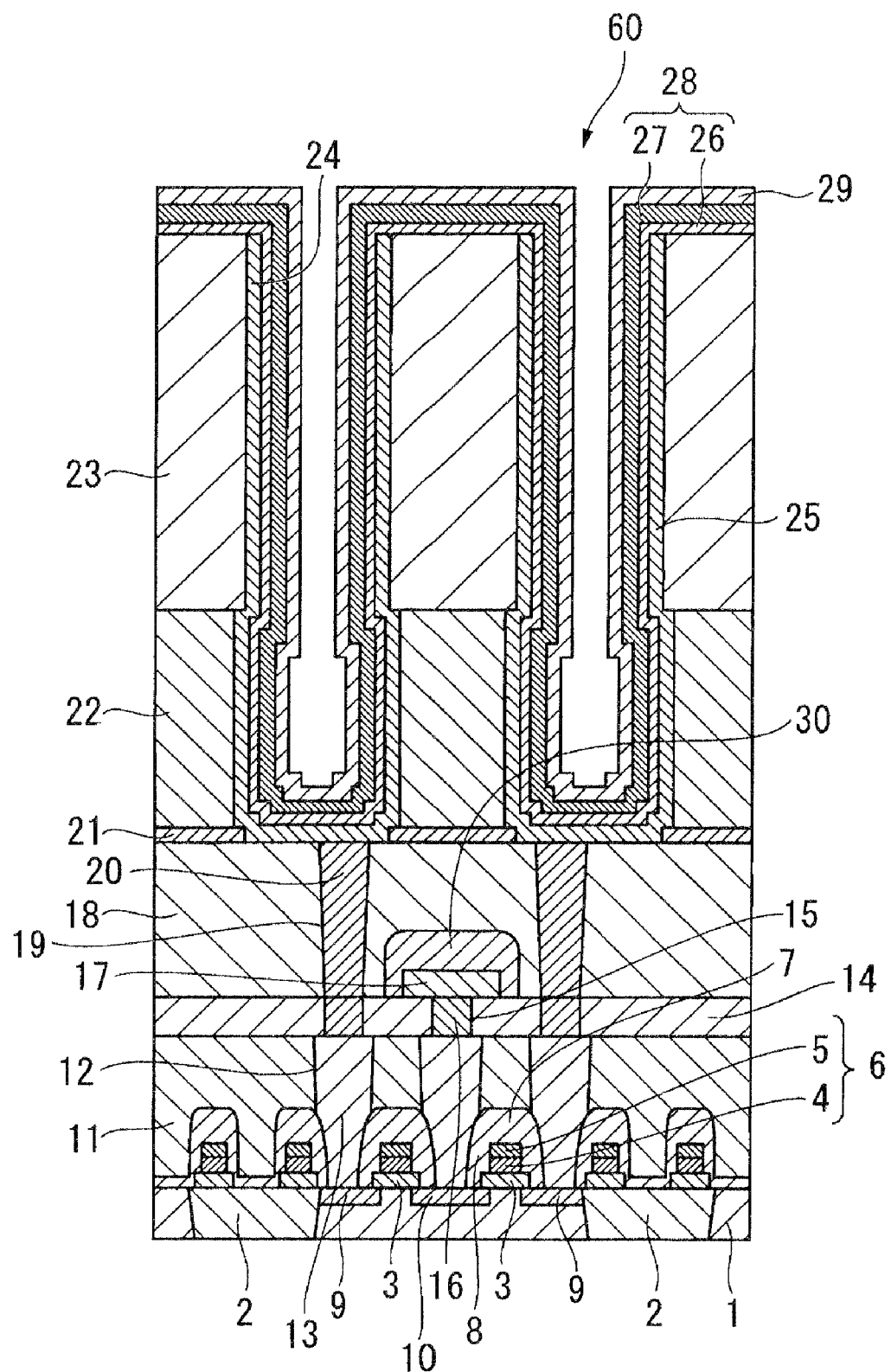
FIG. 1 is a vertical cross-sectional view of a semiconductor device according to one embodiment of the present invention.

FIG. 1 is a vertical cross-sectional view of a semiconductor memory device according to one embodiment of the present invention.

In this figure, a semiconductor substrate 1 is made of semiconductor, for example, silicon, doped with impurities of predetermined concentration.

An insulating isolation region 2 is formed in a portion other than a transistor forming region on the semiconductor substrate 1 by a STI (Shallow Trench Isolation) method for isolation between transistors (select transistors).

In the transistor forming region, a gate insulating film 3 is formed as a silicon oxide film on the semiconductor substrate 1 by, for example, thermal oxidation or the like.

A gate electrode 6 is formed by a multi-layer including a polycrystalline silicon film 4 and a metal film 5. The polycrystalline silicon film 4 may be a polycrystalline silicon film doped with impurities when it is formed by a CVD method. The metal film may be made of high melting point metal such as tungsten (W), tungsten silicide (WSi) or the like.

An insulating film 7 such as silicon nitride (SiN) film is formed on the gate electrode 6, i.e., the metal film 5, and a side wall 8 is formed by an insulating film such as a silicon nitride film or the like on a side wall of the gate electrode 6.

This embodiment shows an exemplary structure when the present invention is applied to a cell structure where a 2-bit memory cell is arranged in one active region surround by the insulating isolation region 2. Impurity diffusion layers are disposed in both ends and a central portion of one active region surrounded by the insulating isolation region 2 shown in FIG. 1. This embodiment shows a basic transistor structure including a drain 10 formed in the central portion, sources 9 formed in the both ends, gate insulating films 3 formed on the sources 9 and the drain 10, and gate electrodes 6 formed on the gate insulating films 3.

A first interlayer insulating film (interlayer insulating film) 11 is entirely formed on the semiconductor substrate 1 and the insulating film 7. The first interlayer insulating film 11 is formed of a laminated film including a BPSG (Boro-Phospho Silicate Glass) film and a TEOS (Tetra Ethyl Ortho Silicate)-NSG (Non-doped Silicate Glass) film.

A cell contact hole 12 is formed in the first interlayer insulating film 11 so that the source 9 and the drain 10 are exposed. The cell contact hole 12 is filled with a polycrystalline silicon film doped with impurities of predetermined concentration, thereby forming a cell contact plug (contact plug) 13.

A second interlayer insulating film 14 is entirely formed on the first interlayer insulating film 11 and the cell contact plug 13. The second interlayer insulating film 14 is formed of a silicon oxide film.

A bit contact hole 15 is formed in the second interlayer insulating film 14 so that a section of the cell contact plug 13 is exposed. The bit contact hole 15 is filled with a conductive material, thereby forming a bit contact plug 16.

A bit wiring layer 17 formed of a metal film such as a tungsten film is formed on the bit contact plug 16. That is, the bit wiring layer 17 is connected to a diffusion layer of the drain 10 via the bit contact plug 16 and the cell contact plug 13. In addition, an oxidation protection film 30 such as a silicon nitride film is formed to cover the bit wiring layer 17.

A third interlayer insulating film 18 is entirely formed on the second interlayer insulating film 14 and the bit wiring layer 17. The third interlayer insulating film 18 is formed of a silicon oxide film formed by a plasma CVD method.

A capacitive contact hole 19 is formed in the third interlayer insulating film 18 and the second interlayer insulating film 14 so that a section of the cell contact hole 12 is exposed. The capacitive contact hole 19 is filled with a polycrystalline silicon film doped with impurities of predetermined concentration, thereby forming a capacitive contact plug (contact plug) 20.

A nitride film 21, a fourth interlayer insulating film 22 and a fifth interlayer insulating film 23 are formed on the third interlayer insulating film 18 and the capacitive contact plug 20. A capacitor deep hole cylinder 24 is formed at a position at which a surface of the capacitive contact plug 20 is exposed, in the nitride film 21, the fourth interlayer insulating film 22 and the fifth interlayer insulating film 23. The fourth interlayer insulating film 22 and the fifth interlayer insulating film 23 become a core of the capacitor deep hole cylinder 24 and are respectively formed of a BPSG (Boro-Phospho Silicate Glass) film and a TEOS (Tetra Ethyl Ortho Silicate)-NSG (Non-doped Silicate Glass) film. In addition, the fifth interlayer insulating film 23 is wider than the fourth interlayer insulating film 22, and accordingly, the capacitor deep hole cylinder 24 has a step in its middle portion in a height direction (an interface between the fourth interlayer insulating film 22 and the fifth interlayer insulating film 23). In addition, the nitride film 21 is used as an etching stopper when the capacitor deep hole cylinder 24 is formed.

A bottom metal electrode 25 is provided in an inner lower side and an inner circumferential side of the capacitor deep hole cylinder 24, and a capacitive insulating film 28 and an upper metal electrode 29 are laminated in order on the bottom metal electrode 25 and the fifth interlayer insulating film 23. That is, a capacitor as a capacitive storage 60 to store data is formed by the bottom metal electrode 25, the capacitive insulating film 28 and the upper metal electrode 29.

In addition, in the semiconductor device 1, particularly, the capacitive insulating film 28 has a first dielectric layer 26 and a second dielectric layer 27 in order from the bottom metal electrode 25.

The first dielectric layer 26 and the second dielectric layer 27 are formed by a vapor phase film forming technique using a precursor gas (compound gas) containing constituent elements of dielectric. A film forming temperature (for example, 300° C.) of the first dielectric layer 26 is lower than that (for example, 400° C.) of the second dielectric layer 27.

When the first dielectric layer 26 is formed at a comparatively low temperature on the bottom metal electrode 25, a defect at an interface between the bottom metal electrode 25 and the capacitive insulating film 26 can be suppressed.

In general, a dielectric layer formed at a lower temperature may be more defective than a dielectric layer formed at a higher temperature. However, in the capacitive insulating film 28, since the second dielectric layer 27 formed at the higher film forming temperature is formed on the first dielectric layer 26 formed at the lower film forming temperature and film quality of the second dielectric layer 27 is reflected in a portion occupied by the second dielectric layer 27, a defect in the capacitive insulating film 28 can be suppressed as a whole by controlling an occupation ratio of the second dielectric layer 27.

Accordingly, a semiconductor device having such a capacitive insulating film 28 can obtain limited leakage current and large capacitance.

Next, a method of manufacturing the semiconductor device of the present invention will be described with reference to FIGS. 2 to 7. The following description is given to a method of manufacturing a memory cell region of a DRAM. A method of manufacturing a peripheral circuit region is similar to the method of manufacturing the memory cell region, and therefore, explanation thereof will be omitted for the sake of brevity.

FIGS. 2 to 6 are vertical cross-sectional views for explaining a method of manufacturing the semiconductor device of the present invention in a process order.

Figure 2:
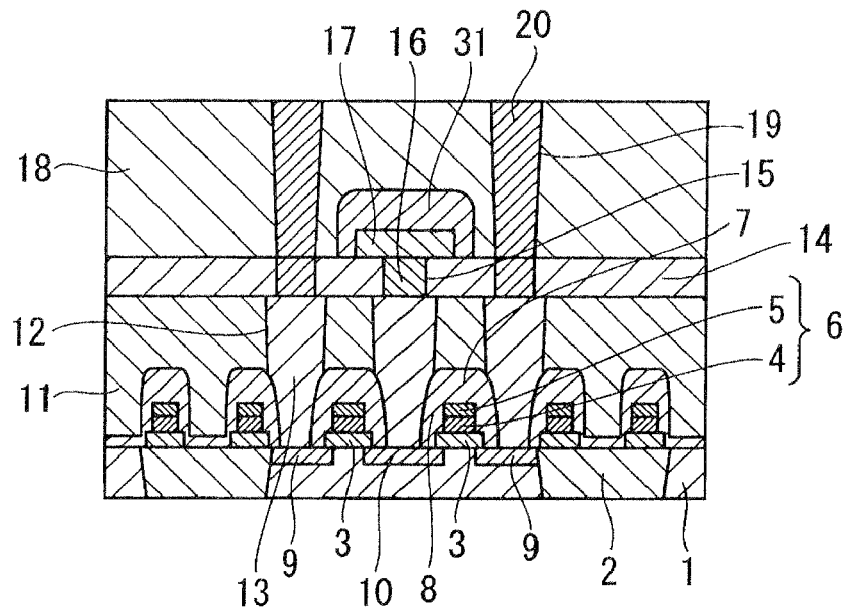
FIG. 2 is a vertical cross-sectional view for explaining a method of manufacturing the semiconductor device in a process order, showing a state where a cell contact plug and a capacitive plug are formed in addition to a transistor structure including a source electrode, a drain electrode and a gate electrode.

First, as shown in FIG. 2, the insulating isolation region 2 is formed on the semiconductor substrate 1, and a transistor including the gate insulating film 3, the gate electrode 6 composed of the silicon film 4 and the metal film 5 such as a W film, the source 9 and the drain 10 consisting of an n type diffusing layer, the insulating film 7, and the side wall 8 are formed in a transistor region partitioned by the insulating isolation region 2.

Next, a BPSG (Boro-Phospho Silicate Glass) film is formed at thickness of 600 nm to 700 nm on the semiconductor substrate 1 and the transistor by a CVD method, and then a surface of the BPSG film is planarized by a reflow of 800° C. and a CMP method. Subsequently, a TEOS (Tetra Ethyl Ortho Silicate)-NSG (Non-doped Silicate Glass) film is formed at thickness of 200 nm or so on the BPSG film, both of which compose the first interlayer insulating film 1.

Next, the cell contact hole 12 reaching the source 9 and the drain 10 consisting of the n type diffusion layer on the semiconductor substrate 1 through the first interlayer insulating film 11 is formed using a photolithography method and a dry etching method and using a photoresist film as a mask. Thereafter, the photoresist film is removed by a dry etching method.

Subsequently, the cell contact hole 12 is filled with a first silicon film made of polycrystalline silicon or amorphous silicon added with impurities such as phosphorus, and simultaneously, the first silicon film is deposited on the first interlayer insulating film 11. Then, the cell contact plug 13 is formed by removing only the first silicon film on the first interlayer insulating film 11 by an etch-back by a chlorine plasma gas using a dry etching method, and a CMP method.

In addition, the impurity concentration of the first silicon film is set to be $1.0 \times 10^{-20}$ to $4.5 \times 10^{-20}$ atoms/cm$^3$. A distance between the top of the first interlayer insulating film 11 and the surface of the semiconductor substrate 1 after removing the first silicon film by the CMP method is about 450 nm.

Next, the second interlayer insulating film 14 such as a silicon oxide film is formed at thickness of 200 nm or so on the entire surface of the first interlayer insulating film 11 forming the cell contact plug 13.

Then, a gate contact hole (not shown) reaching the gate electrode 6 through the second interlayer insulating film 14 and the first interlayer insulating film 11 is formed by a dry etching method using a photoresist film as a mask. The gate contact hole is used to form a gate contact plug to apply a potential to the gate electrode 6. Thereafter, the photoresist film is removed by a dry etching method.

In addition, the bit contact hole 15 reaching the cell contact plug 13 through the second interlayer insulating film 14 is formed by a dry etching method using a photoresist film as a mask. Thereafter, the photoresist film is removed by a dry etching method.

In addition, in the gate contact forming process and the bit contact forming process, a gate contact hole reaching a gate electrode of the peripheral circuit transistor through the second interlayer insulating film 14 and the first interlayer insulating film 11 and a bit contact hole reaching an n type diffusion layer (source electrode and drain electrode) of the peripheral circuit transistor through these films 11 and 14 are formed at once in the peripheral circuit region (not shown).

Next, Ti and TiN as barrier metal are in turn formed at thickness of 11 nm and 13 nm, respectively, in the bit contact hole 15 and the gate contact hole and on the second interlayer insulating film 14 by a CVD method, and then, tungsten is filled in the bit contact hole 15 and is formed at thickness of 200 nm or so on the TiN film formed on the second interlayer insulating film 14. Then, Ti, TiN and tungsten out of the bit contact hole 15 are removed by a CMP method to form the bit contact plug 16.

Next, a tungsten nitride film and a tungsten film are in turn formed at thickness of 10 nm and 40 nm, respectively, on the second interlayer insulating film 14, the bit contact plug 16 and the gate contact plug by a sputtering method. Then, the tungsten nitride film and the tungsten film are patterned by a photolithography method and a dry etching method to form the bit line 17 electrically connected to the bit contact plug 16. Then, the silicon nitride film 30 as the oxidation protection film of the bit line 17 is formed at thickness of 5 mm or so by a CVD method.

Next, a silicon oxide film as the third interlayer insulating film 18 is formed at thickness of 500 nm on the second interlayer insulating film 14, the bit contact plug 16 and the bit line 17 by a plasma CVD method, and a surface of the silicon oxide film is planarized by a CMP method. After the planarization, a distance between the top of the third interlayer insulating film 18 and the top of the bit line 17 is 300 nm or so.

Next, the capacitive contact hole 19 reaching the cell contact plug 13 through the third interlayer insulating film 18 and the second interlayer insulating film 14 is formed on the third interlayer insulating film 18 by a photolithography method and a dry etching method. The capacitive contact hole 19 is used to form the capacitive plug 20 to connect the cell contact plug 13 to the capacitor deep hole cylinder 24.

Subsequently, the capacitive contact hole 19 is filled with a second silicon film made of polycrystalline silicon or amorphous silicon added with impurities such as phosphorus, and simultaneously, the second silicon film is deposited on the third interlayer insulating film 18. Then, the capacitive contact plug 20 is formed by removing only the second silicon film on the third interlayer insulating film 18 by an etch-back by a chlorine plasma gas using a dry etching method, and a CMP method.

In addition, the impurity concentration of the second silicon film is set to be $1.0 \times 10^{-20}$ to $4.5 \times 10^{-20}$ atoms/cm$^3$. Since the third interlayer insulating film 18 is cut when the second silicon film is removed, a distance between the top of the third interlayer insulating film 18 and the top of the bit line 17 is about 200 nm.

Figure 3:
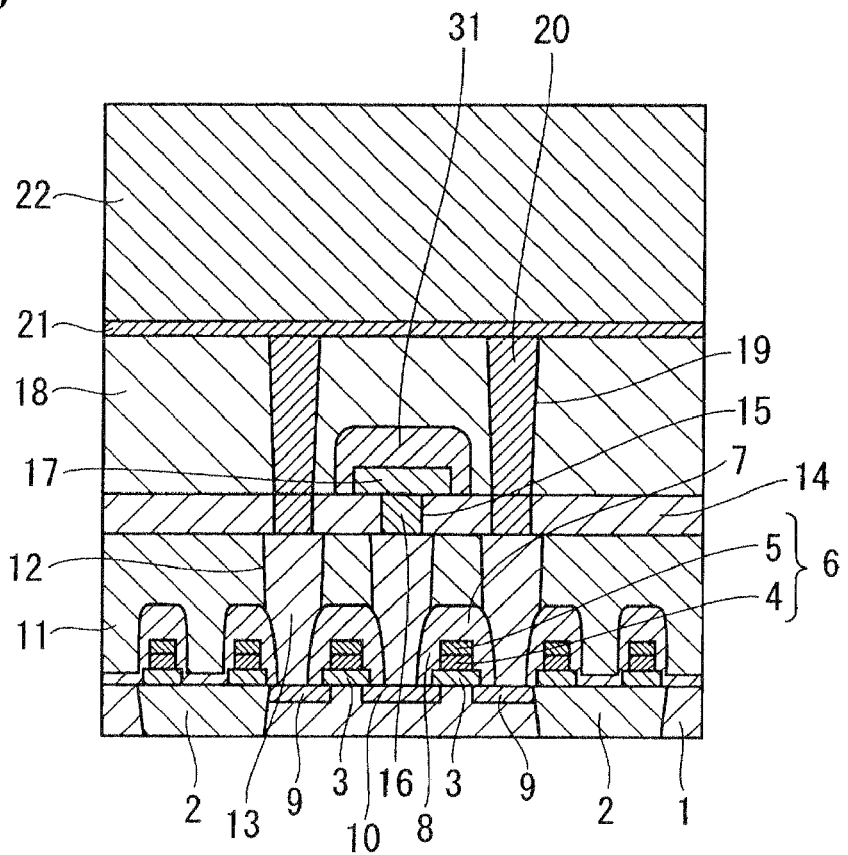
FIG. 3 is a vertical cross-sectional view for explaining a method of manufacturing the semiconductor device in a process order, showing a state where a first cylinder hole is formed in an interlayer insulating film.
Figure 4:
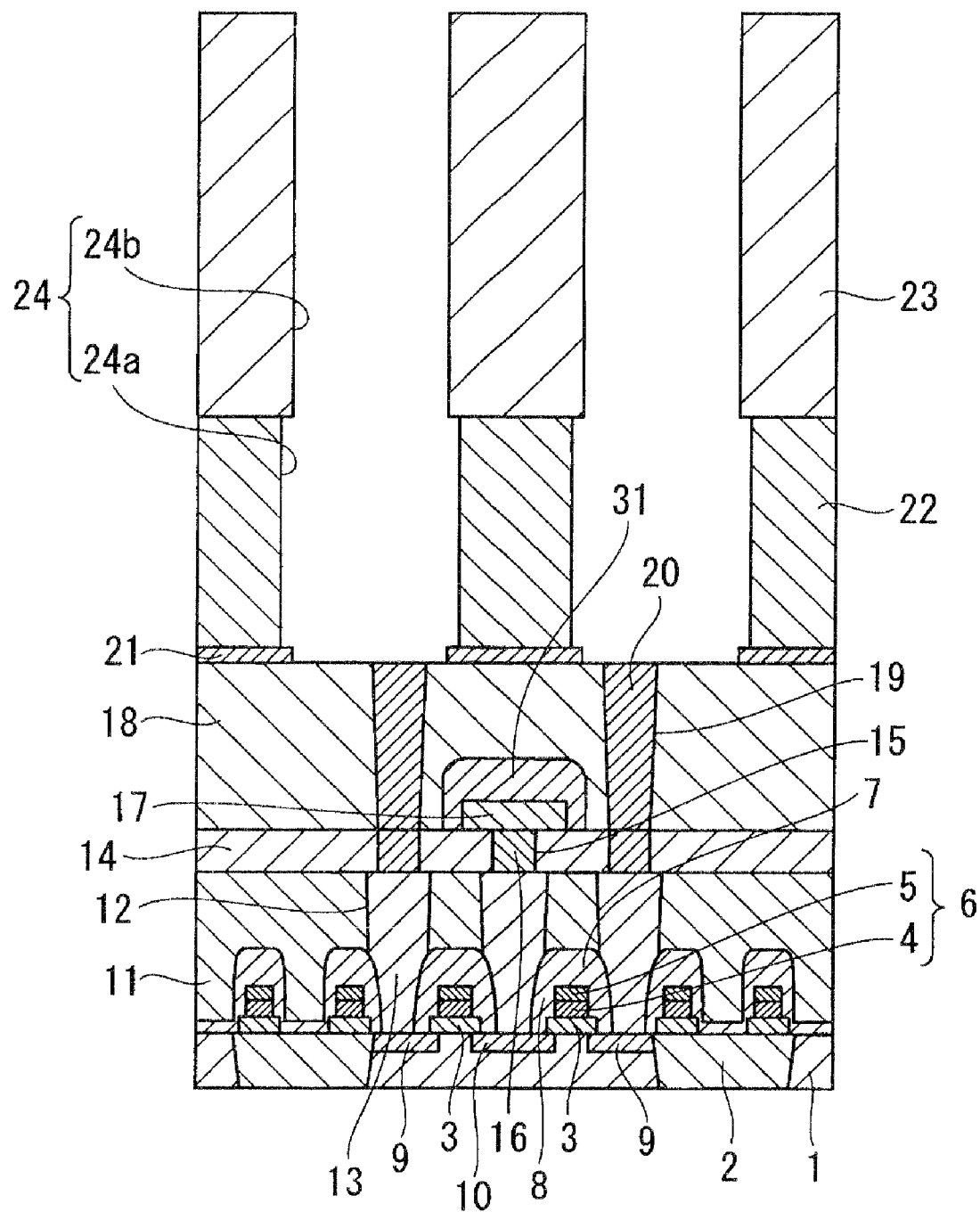
FIG. 4 is a vertical cross-sectional view for explaining a method of manufacturing the semiconductor device in a process order, showing a state where a second cylinder hole is formed in an interlayer insulating film.

Next, the etching stopper nitride film 21 is formed on the third interlayer insulating film 18 and the capacitive contact plug 20, and the fourth interlayer insulating film 22 and the fifth interlayer insulating film 23 as the cylinder core are formed on the etching stopper nitride film 21. For this, a BPSG film is formed at thickness of 500 to 1000 nm, and a TEOS-NSG film is formed at thickness of 1000 to 2000 nm thereon. In addition, as shown in FIG. 3, using a photolithography method and a dry etching method, two layers are etched, and a second cylinder hole 24b and a first cylinder hole 24a reaching the capacitive contact plug 20 through the fifth interlayer insulating film 23 and the fourth interlayer insulating film 22 are formed. Here, due to a washing process, the second cylinder hole 24b becomes narrower than the first cylinder hole 24a.

Thereafter, a filler in the first cylinder hole 24a is removed by an organic solvent.

From the above processes, the capacitor deep hole cylinder 24 reaching the capacitive contact plug 20 through the fourth interlayer insulating film 22 and the fifth interlayer insulating film 23 can be obtained.

Next, prior to forming the bottom metal electrode 26 in a next process, in order to suppress resistance at an interface with the capacitive contact plug 20, a wet pretreatment is carried out by a hydrofluoric acid solution to remove a natural oxide film attached to a surface of the second silicon film in the capacitive contact hole 19.

Figure 5:
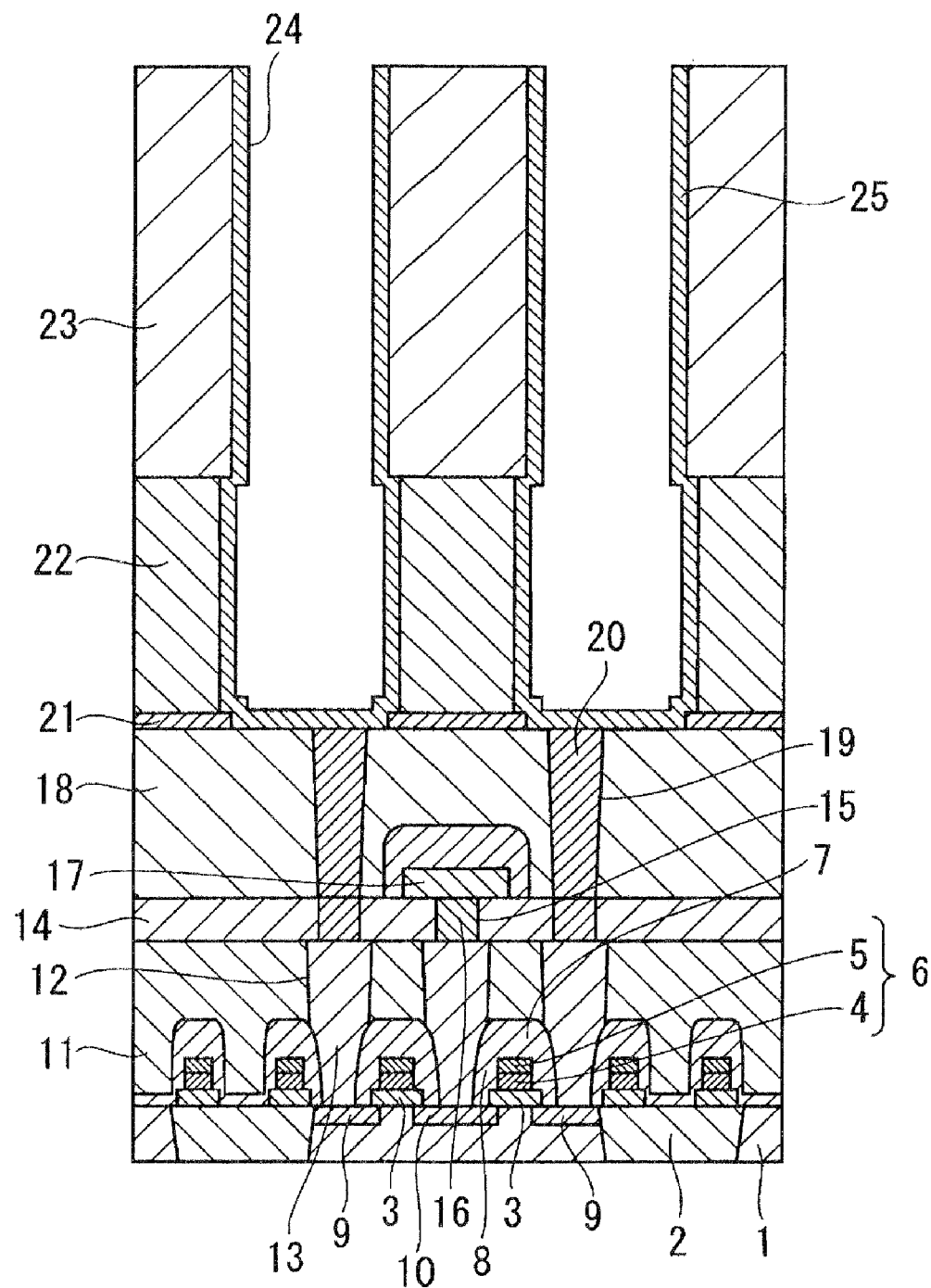
FIG. 5 is a vertical cross-sectional view for explaining a method of manufacturing the semiconductor device in a process order, showing a state where a bottom metal electrode is formed in a deep hole cylinder.

Next, as shown in FIG. 5, the bottom metal electrode 25 having an MIM structure is formed.

For example, a laminated film including a Ti film and a TiN film laminated in order using a high temperature plasma method and a CVD method is provided as the bottom metal electrode 25. Thickness of the Ti film and thickness of the TiN film are set to be 10 nm and 20 nm or so, respectively. When the Ti film is formed at a high temperature of 650° C. or so, the Ti film is silicided in-situ as silicon of the capacitive contact plug 20 exposed to the bottom of the capacitor deep hole cylinder 24 reacts with Ti. As a result, a film having low resistance, which is called silicide ($TiSi_2$), is formed at an interface between the capacitive contact plug 20 and the bottom metal electrode 25.

After forming the bottom metal electrode 25, a metal film (bottom metal electrode 25) of a partition of the capacitor deep hole cylinder 24 is removed. Specifically, a positive resist is coated on the entire surface, and the entire surface is exposed and developed. Accordingly, only the capacitor deep hole cylinder 24 is not exposed to light and the resist remains. The resist is used as a protection film to protect the bottom metal electrode 25 in the capacitor deep hole cylinder 24, and the bottom metal electrode 25 formed in the partition of the cylinder 24 is etched back by anisotropic etching method using Cl. Accordingly, only the bottom metal electrode 25 in the capacitor deep hole cylinder 24 remains. Then, the resist is removed using peeling (plasma peeling) by a dry etching method and an organic peeling solution (for example, article name N311).

Figure 6:
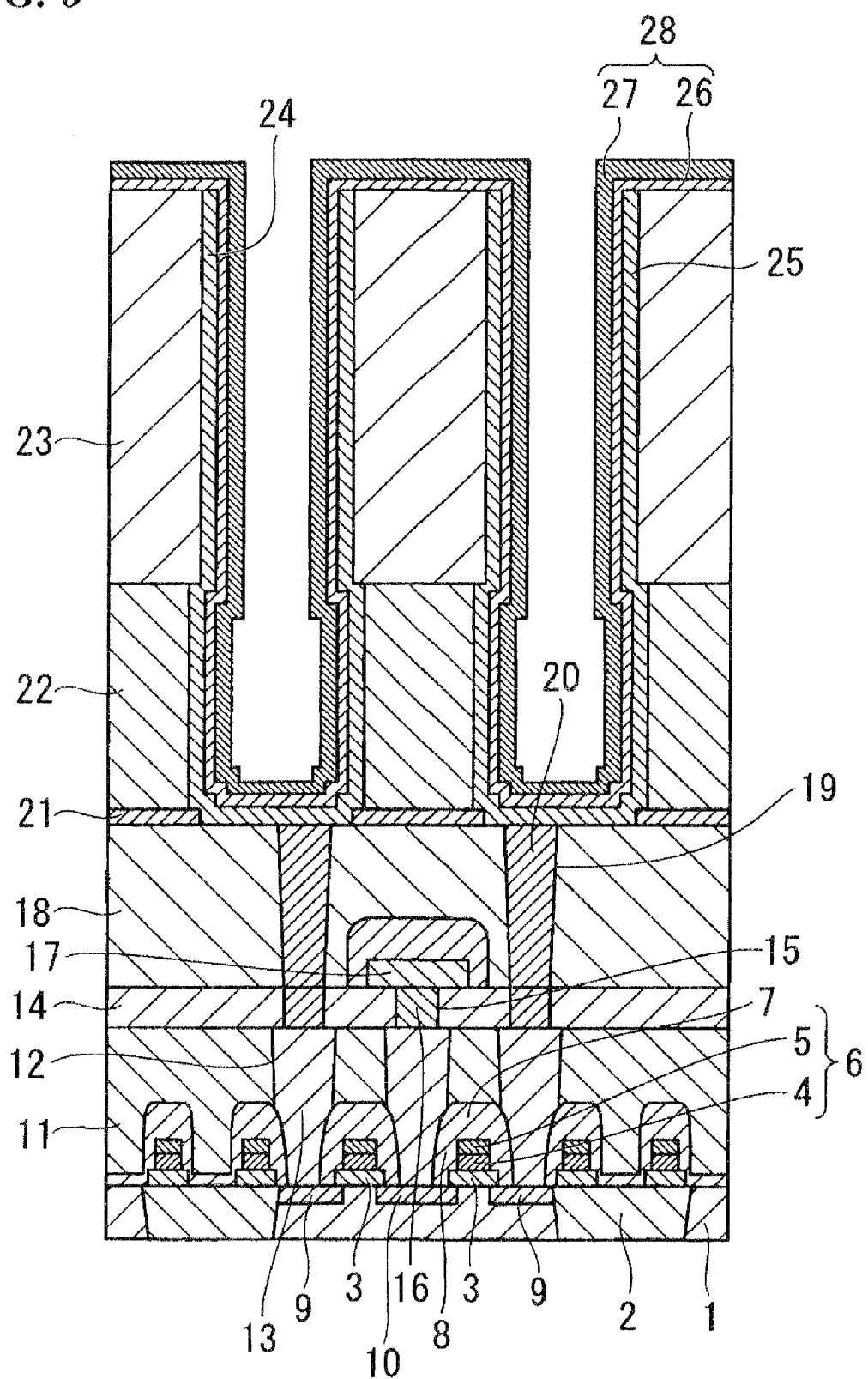
FIG. 6 is a vertical cross-sectional view for explaining a method of manufacturing the semiconductor device in a process order, showing a state where a capacitive insulating film is formed on a bottom metal electrode.

Next, as shown in FIG. 6, the capacitive insulating film 28 is formed in the capacitor deep hole cylinder 24 and on its partition.

In this manufacturing method, a laminated film including the first dielectric layer 26 and the second dielectric layer 27 laminated in order is provided as the capacitive insulating film 28.

The first dielectric layer 26 and the second dielectric layer 27 are formed by a vapor phase film forming method using a compound gas (precursor gas) containing constituent elements of dielectric.

An example of the vapor phase film forming method may include atomic layer deposition (ALD), chemical vapor deposition (CVD), etc. Preferably, the ALD method is used. In order to form the dielectric layer using the ALD method, a process of introducing a precursor gas that contains metal and forming a metal film by depositing metal produced by reaction of the precursor gas on a film and a process of introducing an oxidation gas and oxidizing the metal film into a dielectric layer are alternately carried out.

In the ALD method, an ultra-thin film corresponding to one atomic layer every cycle is formed and grown at about the same speed over the entire range of a film forming region, it is possible to control film thickness with high precision at a level of atomic layer and form a uniform film with high reproducibility. Also, a film with high step coverage can be formed. A gas used in the ALD method is not limited to the above-mentioned gas but may depend on composition of a dielectric layer to be formed.

In this manufacturing method, when the first dielectric layer 26 and the second dielectric layer 27 are formed by the vapor phase film forming method, the film forming temperature of the first dielectric layer 26 is set to be lower than that of the second dielectric layer 27 for the following reason.

That is, when the dielectric layer is formed on the surface of the bottom metal electrode 25 by the vapor phase film forming method, if the film forming temperature is set to be low, defect in the dielectric layer becomes more although detect at an interface between the bottom metal electrode 25 and the dielectric layer becomes fewer. On the contrary, if the film forming temperature is set to be high, detect at the interface between the bottom metal electrode 25 and the dielectric layer becomes more although defect in the dielectric layer becomes fewer.

For this reason, the first dielectric layer 26 forming the interface with the bottom metal electrode 25 may be formed at a lower temperature (for example, 200 to 530° C.), and then, the second dielectric layer 27 may be formed at a higher temperature (for example, 250 to 550° C.) on the first dielectric layer 26.

Accordingly, defect at the interface between the bottom metal electrode 15 and the capacitive insulating film 28 (first dielectric layer 26) is suppressed to be few. In addition, since film quality of the second dielectric layer 27 is reflected in a portion of the capacitive insulating film 28 occupied by the second dielectric layer 27, defect in the capacitive insulating film 28 can be suppressed as a whole by controlling an occupation ratio of the second dielectric layer 27.

Accordingly, a semiconductor device having such a capacitive insulating film 28 can obtain limited leakage current and large capacitance.

The film forming temperature of the second dielectric layer 27 is preferably 250 to 550° C., more preferably 250 to 400° C. If the film forming temperature is less than 250° C., film quality of the second dielectric layer 27 becomes bad, which may result in increase of defect in the film. If the film forming temperature is more than 550° C., it may result in increase of defect at the interface between the capacitive insulating film 28 and the first dielectric layer 26.

The film forming temperature of the first dielectric layer 27 is preferably 250 to 550° C., more preferably 250 to 400° C. If the film forming temperature is less than 250° C., film quality of the second dielectric layer 27 becomes bad, which may result in increase of defect in the film. If the film forming temperature is more than 550° C., it may result in increase of defect at the interface between the capacitive insulating film 28 and the first dielectric layer 26.

Figure 7:
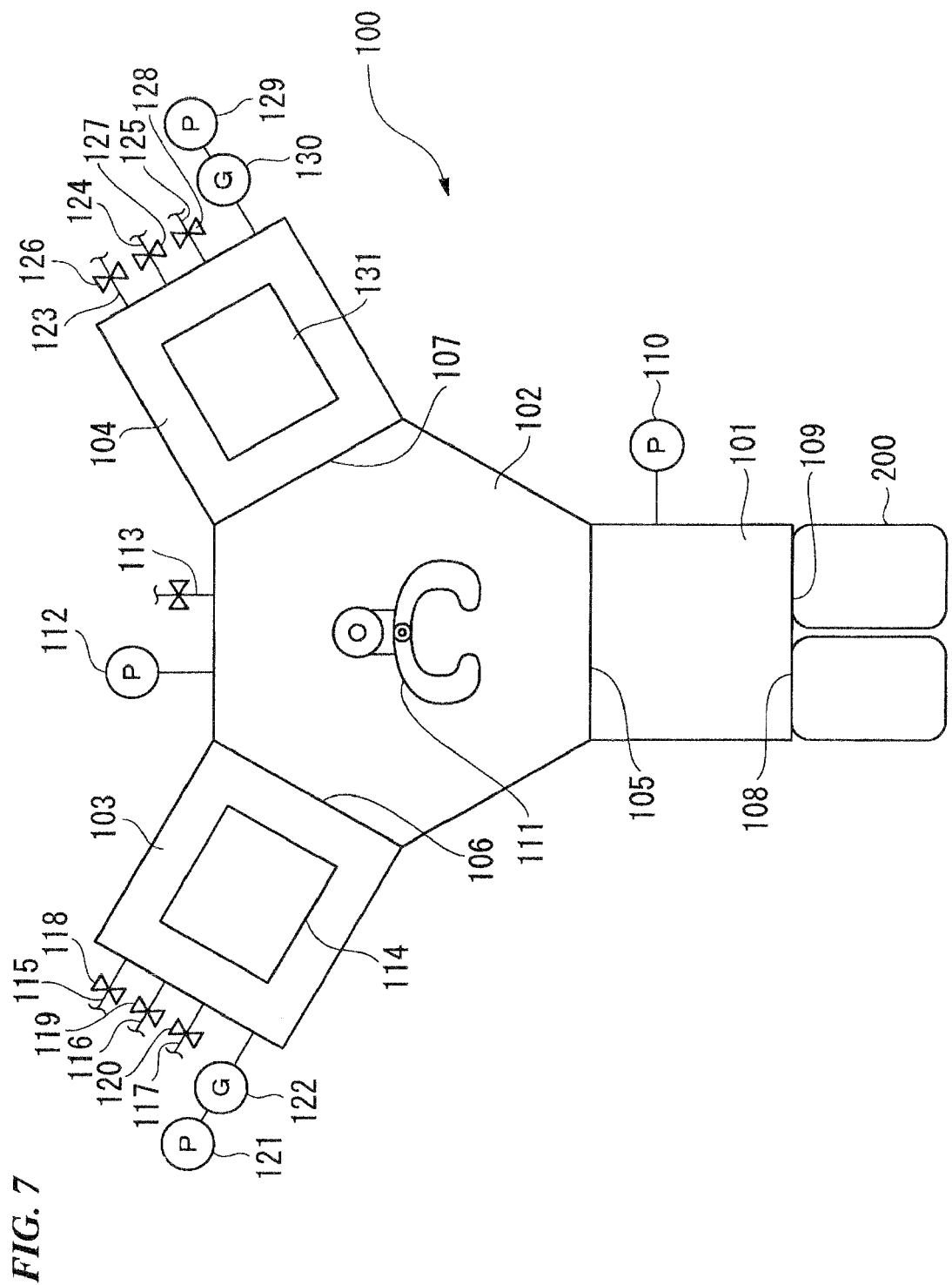
FIG. 7 is a schematic view showing an example of a film forming apparatus used to form a capacitive insulating film.

FIG. 7 shows an example of a film forming apparatus for forming the first dielectric layer 26 and the second dielectric layer 27 by an atomic layer deposition method with the film forming temperature of the first dielectric layer 26 set to be lower than that of the second dielectric layer 27.

This type of film forming apparatus 100 includes a load lock chamber 101, a transfer chamber 102 connected to the load lock chamber 101, and first and second atomic layer deposition chambers 103 and 104 connected to the transfer chamber 102. First to third gate valves 105 to 107 are provided in connections between these chambers 101, 102, 103 and 104, and, when these gate valves 105, 106 and 107 are closed, these chambers have respective independent sealed space.

The load lock chamber 101 is a chamber for carrying a semiconductor substrate 200 to be treated in and out of the film forming apparatus 100. The load lock chamber 101 is provided with an opening 108 for carrying in and out the semiconductor substrate 200 and a door 109 that opens/closes the opening 108, both of which are formed at one side wall of the chamber 101. The load lock chamber 101 is connected to a vacuum pump 110 to reduce the internal pressure of the load lock chamber 101.

The transfer chamber 102 is connected to the load lock chamber 101 and the first and second atomic layer deposition chambers 103 and 104, and is therein provided with a transfer arm 111 to transfer the semiconductor substrate 200 carried in the load lock chamber 101 into the first and second atomic layer deposition chambers 103 and 104. The transfer chamber 102 is connected to a vacuum pump 112 and an inert gas supply pipe 113. The vacuum pump 112 reduces the internal pressure of the transfer chamber 102, and an inert gas is supplied from the inert gas supply pipe 113 to put the chamber 102 in an inert gas atmosphere.

The first and second atomic layer deposition chambers 103 and 104 has the same structure except for different film forming temperature (substrate heating temperature), and therefore, the first atomic layer deposition chamber 103 will be representatively described.

The first atomic layer deposition chamber 103 has therein a stage (holder) 114 on which the semiconductor substrate is placed. The stage 114 contain a heating unit (not shown) and a heating control unit (not shown) for controlling heating temperature by the heating unit. With this configuration, the semiconductor substrate placed on the stage 114 is heated to a predetermined temperature (film forming temperature).

The first atomic layer deposition chamber 103 is connected to a precursor gas supply pipe 115, an oxidation gas supply pipe 116, a purge gas supply pipe 117 and a vacuum pump 121. These supply pipes 115, 116 and 117 are respectively provided with first to third valves 118 to 120 opened/closed by a control unit (not shown), and a gate valve 122 opened/closed by a control unit (not shown) is provided between the vacuum pump 121 and the first atomic layer deposition chamber 103. By opening/closing these valves 118, 119 and 120 and the gate valve 122, supply of gas from the supply pipes and pressure and gas discharge in the first atomic layer deposition chamber 103 are controlled.

The second atomic layer deposition chamber 104 includes a stage 131, a precursor gas supply pipe 123, an oxidation gas supply pipe 124, a purge gas supply pipe 125, first to third valves 126 to 128, a vacuum pump 129, and a gate valve 130, all of which have the same configuration as the first atomic layer deposition chamber 103.

Next, a process of forming the first and second dielectric layers 26 and 27 using the film forming apparatus 100 will be described.

[1] First, the chambers 102, 103 and 104 are put in the condition of reduced pressure except for the load lock chamber 101. Next, after carrying the semiconductor substrate drawn out of a substrate cassette 200 into the load lock chamber 101, the vacuum pump 110 reduces the internal pressure of the load lock chamber 101.

Next, the semiconductor substrate is placed on the stage 114 in the first atomic layer deposition chamber 103 through the load lock chamber 101 and the transfer chamber 102 by open/close of the gate valves and operation of the transfer arm 111, and then is heated to a predetermined temperature (film forming temperature) by means of the heating unit.

[2] Next, the first valve 118 is opened to supply a precursor gas, and the precursor gas is thermally decomposed and absorbed on the surface of the semiconductor substrate to form a film (nearly one atomic layer).

Next, the precursor gas is exhausted by open/close operation of the valves. If necessary, it is preferable to supply and exhaust an inert purge gas to completely remove the precursor gas.

[3] Next, the second valve 119 is opened to supply an oxidation gas, and an oxide film (dielectric layer) is formed by reacting a film formed on the semiconductor substrate with the oxidation gas. After completing the oxidation process, the oxidation gas is exhausted. If necessary, it is preferable to supply and exhaust an inert purge gas to completely remove the oxidation gas.

[4] Next, a film composed of constituent elements of the precursor gas is formed in the same way as the above process [2].

The first dielectric layer 26 is formed by repeating the above processes [2] to [4] until the dielectric layer reaches a predetermined thickness.

Thereafter, the semiconductor substrate on the stage 114 is transferred onto the stage 131 in the second atomic layer deposition chamber 104 via the transfer chamber 102 by means of the transfer arm 111, and then, the semiconductor substrate is heated to a temperature higher than the temperature in the first atomic layer deposition chamber 103 by means of the heating unit.

In the second atomic layer deposition chamber 104, the second dielectric layer 27 is formed in the same way as the first dielectric layer 26 except that the heating temperature of the semiconductor substrate is set to be higher than the heating temperature in the first atomic layer deposition chamber 103.

Next, the gate valve 130 for pump is opened to exhaust gas in the second atomic layer deposition chamber 104, and the semiconductor substrate on the stage 131 is carried out to the outside via the load lock chamber 101 by open/close of the gate valve and transfer of the transfer arm 111.

Through the above processes, the capacitive insulating film composed of the first and second dielectric layers can be obtained.

Here, an example of the precursor gas used in the first and second atomic layer deposition chambers 103 and 104 may include PET (pentaethoxytantalum), TMA (trimethylaluminum), TEMAN (tetrakisethylmethylaminohafnium), TEMAZ (tetrakisethylmethylaminozirconium), or combinations of two or more kinds of these gases. The precursor gas may be the same or different in the first and second atomic layer deposition chambers 103 and 104.

An example of the oxidation gas used in the first and second atomic layer deposition chambers 103 and 104 may include vapor ($H_2O$), oxygen ($O_2$) gas, ozone ($O_3$) gas, or combinations of two or more kinds of these gases. The oxidation gas may be the same or different in the first and second atomic layer deposition chambers 103 and 104.

It is preferable to use vapor in the first atomic layer deposition chamber 103 and use ozone gas in the second atomic layer deposition chamber 104. When the ozone gas is used as an oxidizer, detect at the interface between the dielectric layer and the bottom metal electrode becomes more although detect in the dielectric layer becomes fewer, as compared to when the vapor is used as an oxidizer. Accordingly, in the first atomic layer deposition chamber 103, by forming the first dielectric layer 26 using the vapor as the oxidizer, defect at the interface between the bottom metal electrode 25 and the first dielectric layer 26 can be suppressed to be fewer.

In addition, in the second atomic layer deposition chamber 104, by forming the second dielectric layer 27 using the ozone gas as the oxidizer, defect in the second dielectric layer 27 can be suppressed to be fewer.

An example of the purge gas may include inert gas such as nitrogen gas, argon gas and the like, or combinations of two or more kinds of these gases. The purge gas used in the first atomic layer deposition chamber 103 may be the same as or different from that used in the second atomic layer deposition chamber 104.

In addition, when the above precursor gas and oxidation gas are used, although a metal oxide layer is formed as the dielectric layer, the dielectric layer is not limited to the metal oxide layer but may be dielectric layer other than the metal oxide layer. In this case, gas supplied into the first and second atomic layer deposition chambers 103 and 104 may be selected depending on composition of the dielectric layer. For example, if a nitride film is formed as the dielectric layer, nitrogen gas or the like instead of the oxidation gas may be supplied.

Examples of the first and second dielectric layers 26 and 27 may include, not particularly limited to, silicon oxide ($SiO_2$), silicon nitride ($Si_3N_4$), tantalum pentaoxide ($Ta_2O_5$), aluminum oxide ($Al_2O_3$), hafnium oxide ($HfO_2$), zinc oxide ($ZrO_2$), etc. The first and second dielectric layers may be composed of the same dielectric material or different dielectric materials.

If the first and second dielectric layers 26 and 27 are composed of different dielectric materials, it is preferable that the first dielectric layer 26 is composed of a dielectric having oxygen permeability lower than that of the second dielectric layer 27. Accordingly, in the process of forming the second dielectric layer 27, various gases permeate the first dielectric layer 26, and thus it is prevented that defect at the interface between the bottom metal electrode 25 and the first dielectric layer 26 occurs.

An example of the dielectric having low oxygen permeability may include a silicon nitride ($Si_3N_4$), aluminum oxide ($Al_2O_3$), etc. When the first dielectric layer 26 is composed of the dielectric having low oxygen permeability, hafnium oxide ($HfO_2$), zinc oxide ($ZrO_2$), etc. are suitably used for the second dielectric layer 27. If a process of supplying nitrogen (N) gas in the first atomic layer deposition chamber 103 is added when the first dielectric layer 26, the first dielectric layer 26 having low oxygen permeability can be obtained.

After forming the first and second dielectric layers 26 and 27, it is preferable that the semiconductor substrate is subjected to a heat treatment (post annealing treatment) in a reduction atmosphere. The precursor gas used in the atomic layer deposition method is an organic matter in many cases. The organic matter is mixed as impurities into the first and second dielectric layers 26 and 27 in the process of forming these layers 26 ad 27, thereby deteriorating a capacitor characteristic. The post annealing treatment is carried out to volatilize out the organic matter mixed into the layers, thereby preventing the capacitor characteristic from be deteriorated due to the mixture of organic matter into the layers. In addition, the post annealing treatment may be carried out before the second dielectric layer 27 is formed after the first dielectric layer 26 is formed. Further, the post annealing treatment may be carried out before and after the second dielectric layer 27 is formed after the first dielectric layer 26 is formed.

An example of the reduction atmosphere may include, not particularly limited to, a $H_2$ atmosphere, a $NH_3$ atmosphere, etc.

A heating temperature for the post annealing treatment is preferably 250° C. to 600° C., more preferably 300° C. to 500° C. If the heating temperature is lower than the lower limit, an effect of the post annealing treatment may not be sufficiently attained. If the heating temperature is higher than the upper limit, energy required for heating is wastefully consumed without attaining any suitable effect.

Next, a TiN film as the upper metal electrode 29 is formed on the capacitive insulating film 28 formed so. Thus, a semiconductor device having a capacitor of the MIM structure is completed (FIG. 1).

In the semiconductor device manufactured so, since the capacitive insulating film 28 is formed by forming the first dielectric layer 26 at a relatively low film forming temperature on the bottom metal electrode 25 and forming the second dielectric layer 27 at a low film forming temperature higher than that of the first dielectric layer 26 on the first dielectric layer 26, defect at the interface between the bottom metal electrode 25 and the first dielectric layer 26 and defect in the capacitive insulating film 28 can be suppressed to be fewer. For example, it is possible to obtain a laminated structure including the first dielectric layer 26, which is formed at a relatively low temperature of 300° C. or so on the bottom metal electrode 25 and has fewer defect at the interface with the bottom metal electrode 25, and the second dielectric layer 27 which is formed at a relatively high temperature of 400° C. or so on the first dielectric layer 26 and has fewer defect.

Accordingly, a semiconductor memory device, for example, DRAM, having such a capacitor structure can obtain limited leakage current and large capacitance.

In the above-described embodiment, materials, film thickness and forming method of parts of the semiconductor memory device are only illustrated by way of examples, but may be modified without departing from the spirit and scope of the present invention.

EXAMPLE

Hereinafter, the present invention will be described in more detail through Examples.
Relationship Between Defect Density and Leakage Current (Experimental Example)

An $Al_2O_3$ film having a thickness of 1 nm is formed at a film forming temperature of 300° C. on a TiN film formed on a flat substrate using the film forming apparatus shown in FIG. 7, and an $Al_2O_3$ film having a thickness of 6 nm is formed at a film forming temperature of 400° C. thereon. A precursor gas used in forming these films is TMA (trimethylaluminum).

Comparative Experimental Example 1

An $Al_2O_3$ film having a thickness of 7 nm is formed at a film forming temperature of 300° C. on a TiN film formed on a flat substrate using the film forming apparatus shown in FIG. 7.

Comparative Experimental Example 2

An $Al_2O_3$ film having a thickness of 7 nm is formed at a film forming temperature of 400° C. on a TiN film formed on a flat substrate using the film forming apparatus shown in FIG. 7.

Figure 8:
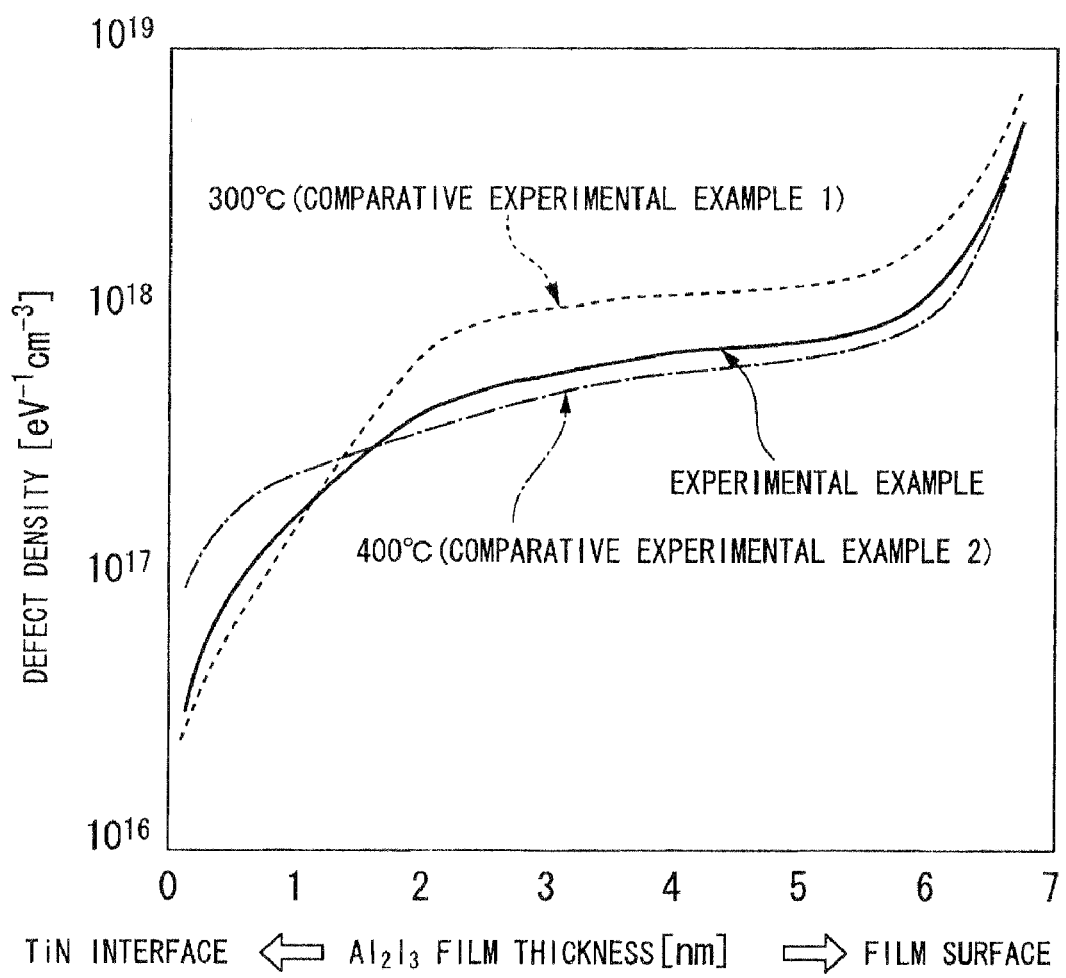
FIG. 8 is a graphical view showing a relationship between film thickness and detect density in Experiment Example 1, Comparative Experiment Example 1 and Comparative Experiment Example 2.

The $Al_2O_3$ films formed in Experimental Example 1 and Comparative Experimental Examples 1 and 2 are irradiated with monochromatic ultraviolet light in an ultra-high vacuum, electrons trapped in defect of the films are collected, and defect density is measured. FIG. 8 shows a relationship between film thickness and defect density in the $A_2O_3$ films.

Figure 9:
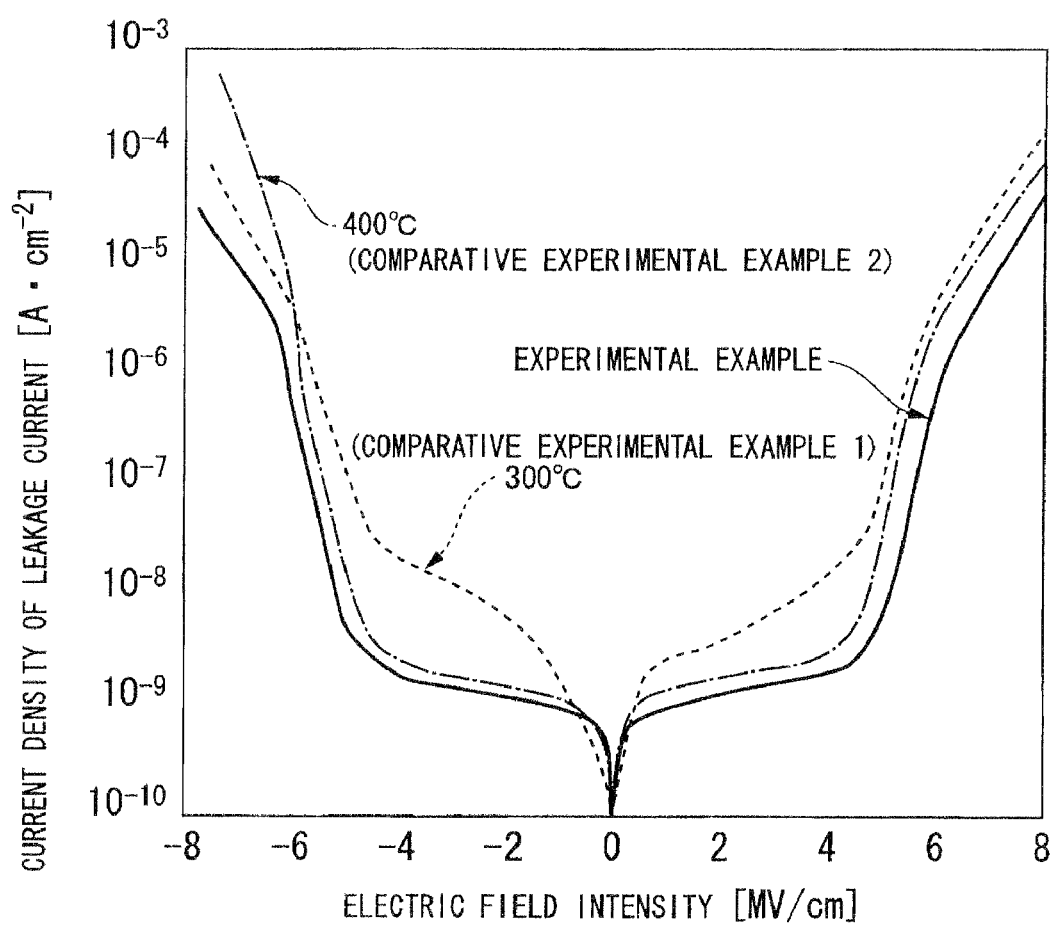
FIG. 9 is a graphical view showing a relationship between electric field intensity and leakage current in Experiment Example 1, Comparative Experiment Example 1 and Comparative Experiment Example 2.

In addition, electric fields having different intensities are applied to the $Al_2O_3$ films formed in Experimental Example 1 and Comparative Experimental Examples 1 and 2, and leakage current in these films is measured. FIG. 9 shows a relationship between electric field intensity and leakage current in the $Al_2O_3$ films.

As shown in FIG. 8, when the thickness of the $Al_2O_3$ films is less than 1.0 nm, the $Al_2O_3$ film formed at 300° C. (Comparative Experimental Example 1) has defect density lower than that of the $Al_2O_3$ film formed at 400° C. (Comparative Experimental Example 2). When the thickness of the $Al_2O_3$ films is more than 1.5 nm, the $Al_2O_3$ film formed at 400° C. (Comparative Experimental Example 2) has defect density lower than that of the $Al_2O_3$ film formed at 300° C. (Comparative Experimental Example 1).

On the other hand, when the thickness of the $Al_2O_3$ films is less than 1.0 nm, the $Al_2O_3$ film formed in Experimental Example has defect density close to that of the $Al_2O_3$ film formed at 300° C. in Comparative Experimental Example 1. When the thickness of the $Al_2O_3$ films is more than 1.5 nm, the $Al_2O_3$ film formed in Experimental Example has defect density close to that of the $Al_2O_3$ film formed at 400° C. in Comparative Experimental Example 2. Defect in total film thickness is suppressed to be few. Leakage current in the $Al_2O_3$ film formed in Experimental Example is suppressed to be less than that of the $Al_2O_3$ films formed in Comparative Experimental Examples 1 and 2, as shown in FIG. 9.

In comparison, for the dielectric layers of the $Al_2O_3$ films, when the thickness of the first dielectric layer formed at a low temperature is less than 2 nm, defect density can be reduced. When the thickness of the second dielectric layer formed at a high temperature is 2 to 7 nm, defect density can be reduced. Accordingly, when both dielectric layers have a preferred film thickness, it is possible to obtain a capacitive insulating film having low defect density as a whole.

Manufacture of Semiconductor Memory Device (Example 1)

First, a semiconductor substrate formed with parts up to a capacitor cylinder is prepared using the method and materials according the above-described embodiment. Then, a bottom metal electrode composed of a TiN film is formed in the capacitor cylinder by a CVD method.

Then, using the film forming apparatus shown in FIG. 7, an $Al_2O_3$ film (first dielectric layer) having a thickness of 1 nm is formed at a film forming temperature of 300° C. on the bottom metal electrode and its partition. The film formation conditions are as follows.

Film forming conditions of first dielectric layer:precursor gas (TMA), oxidation gas:vapor, purge gas:Ar gas. Next, an $Al_2O_3$ film having a thickness of 6 nm is formed at a film forming temperature of 400° C. on the first dielectric layer.

Film forming conditions of second dielectric layer:precursor gas (TMA), oxidation gas:ozone, purge gas:Ar gas.

With the above conditions, a capacitive insulating film composed of the first and second dielectric layers is formed.

An upper metal electrode composed of a TiN film is formed on the capacitive insulating film, and a semiconductor memory device is manufactured through the above-described processes.

Example 2

A semiconductor substrate formed with parts up to a capacitor cylinder is prepared using the method and materials according the above-described embodiment. Then, a bottom metal electrode composed of a TiN film is formed in the capacitor cylinder by a CVD method.

Then, using the film forming apparatus shown in FIG. 7, a semiconductor device is manufactured in the same way as Example 1 except that a capacitive insulating film is formed by forming a $Si_3N_4$ film (first dielectric layer) having a thickness of 1 nm at a film forming temperature of 550° C. on the bottom metal electrode and its partition using dichlorosilane, ammonia and nitrogen, and forming a $ZrO_2$ film (second dielectric layer) having a thickness of 6 nm at a film forming temperature of 300° C. on the $Si_3N_4$ film using TEMAZ (tetrakisethylaminozirconium).

With the above conditions, a semiconductor memory device having a capacitive insulating film composed of the first and second dielectric layers can be obtained. An Ar gas is used as a purge gas.

Example 3

A semiconductor substrate formed with parts up to a capacitor cylinder is prepared using the method and materials according the above-described embodiment. Then, a bottom metal electrode composed of a TiN film is formed in the capacitor cylinder by a CVD method.

Then, using the film forming apparatus shown in FIG. 7, a semiconductor device is manufactured in the same way as Example 1 except for the conditions that a capacitive insulating film is formed by forming an $Al_2O_3$ film (first dielectric layer) having a thickness of 1 nm at a film forming temperature of 300° C. on the bottom metal electrode and its partition using TMA (trimethylaluminum), and forming a $HfO_2$ film (second dielectric layer) having a thickness of 7 nm on the $Al_3O_3$ film using TEMAH (tetrakisethylaminohafnium), and an Ru film is formed as an upper metal electrode. An Ar gas is used as a purge gas.

With the above conditions, a semiconductor memory device having a capacitive insulating film composed of the first and second dielectric layers can be obtained.

Example 4

First, a semiconductor substrate formed with parts up to a capacitor cylinder is prepared using the method and materials according the above-described embodiment. Then, a bottom metal electrode composed of an Ru film is formed in the capacitor cylinder by a CVD method.

Then, using the film forming apparatus shown in FIG. 7, a $Ta_2O_5$ film (first dielectric layer) having a thickness of 2 nm at a film forming temperature of 300° C. on the bottom metal electrode and its partition using PET (pentaethoxytantalum), and a $Ta_2O_5$ film having a thickness of 6 nm is formed at a film forming temperature of 450° C. on the first dielectric layer. An Ar gas is used as a purge gas.

Next, the semiconductor substrate is subjected to an annealing treatment at 450° C. for 10 minutes in a hydrogen atmosphere. Then, an upper metal electrode composed of an Ru film is formed on the capacitive insulating film.

With the above conditions, a semiconductor memory device having a capacitive insulating film composed of the first and second dielectric layers can be obtained.

Example 5

First, a semiconductor substrate formed with parts up to a capacitor cylinder is prepared using the method and materials according the above-described embodiment. Then, a bottom metal electrode composed of a TiN film is formed in the capacitor cylinder by a CVD method.

Then, using the film forming apparatus shown in FIG. 7, a semiconductor device is manufactured in the same way as Example 1 except for the conditions that a capacitive insulating film is formed by forming a $HfO_2$ film (first dielectric layer) having a thickness of 2 nm at a film forming temperature of 300° C. on the bottom metal electrode and its partition, and forming a $HfO_2$ film (second dielectric layer) having a thickness of 6 nm at a film forming temperature of 350° C. on the first dielectric layer using TEMAH (tetrakisethylaminohafnium), and an Ru film is formed as an upper metal electrode. An Ar gas is used as a purge gas.

With the above conditions, a semiconductor memory device having a capacitive insulating film composed of the first and second dielectric layers can be obtained.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

The present invention is applicable to a semiconductor memory device having a capacitor laminated in the form of a cylinder on a semiconductor substrate for use in a dynamic random access memory (DRAM), which is a so-called stacked capacitor.

What is claimed is:

1. A method of manufacturing a semiconductor device having a capacitor, where the capacitor is made by the method comprising the steps of:
laminating a bottom metal electrode, a capacitive insulating film on the bottom metal electrode, and an upper metal electrode on the capacitive insulating film,
wherein the step of laminating the capacitive insulating film includes a first step of laminating a first dielectric layer on the bottom metal electrode by a vapor phase film forming method using a precursor gas that contains constituent elements of a dielectric, and a second step of laminating a second dielectric layer on the first dielectric layer by a vapor phase film forming method using a precursor gas that contains constituent elements of a dielectric, and wherein a maximum temperature at which the first dielectric layer is laminated in the first step is lower than a temperature at which the second dielectric layer is laminated in the second step.

2. The method of manufacturing a semiconductor device, according to claim 1, wherein an atomic layer deposition method is used as the vapor phase film forming method in the first step and the second step.

3. The method of manufacturing a semiconductor device, according to claim 2, wherein the atomic layer deposition method in the first step and the second step performs alternately:
a step of forming a metal film by depositing metal, which is produced by reaction of a precursor gas that contains metal, on a film; and
a step of oxidizing the metal film by an oxidation gas and changing the oxidized metal film into a dielectric layer.

4. The method of manufacturing a semiconductor device, according to claim 3, wherein vapor is used as the oxidation gas in the first step.

5. The method of manufacturing a semiconductor device, according to claim 3, wherein an ozone gas is used as the oxidation gas in the second step.

6. The method of manufacturing a semiconductor device, according to claim 1, wherein oxygen permeability of the first dielectric layer is set so as to be lower than oxygen permeability of the second dielectric layer.

7. The method of manufacturing a semiconductor device, according to claim 1, wherein nitrogen is supplied in a film forming atmosphere in the first step.

8. The method of manufacturing a semiconductor device, according to claim 7, wherein at least one of a silicon nitride and an aluminum oxide is used as a main material of the first dielectric layer formed in the first step.

* * * * *